United States Patent
Torii et al.

(10) Patent No.: US 12,512,791 B2
(45) Date of Patent: Dec. 30, 2025

(54) DOHERTY AMPLIFIER

(71) Applicant: Mitsubishi Electric Corporation, Tokyo (JP)

(72) Inventors: Takuma Torii, Tokyo (JP); Yuji Komatsuzaki, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 663 days.

(21) Appl. No.: 17/893,316

(22) Filed: Aug. 23, 2022

(65) Prior Publication Data
US 2022/0407468 A1 Dec. 22, 2022

Related U.S. Application Data

(63) Continuation of application No. PCT/JP2020/017949, filed on Apr. 27, 2020.

(51) Int. Cl.
| | |
|---|---|
| *H03F 3/68* | (2006.01) |
| *H03F 1/02* | (2006.01) |
| *H03F 3/21* | (2006.01) |

(52) U.S. Cl.
CPC ........... *H03F 1/0288* (2013.01); *H03F 3/211* (2013.01); *H03F 2200/451* (2013.01)

(58) Field of Classification Search
CPC .. H03F 1/0288; H03F 3/211; H03F 2200/451; H03F 3/602; H03F 2200/255;
(Continued)

(56) References Cited

U.S. PATENT DOCUMENTS

| | | | |
|---|---|---|---|
| 7,893,762 B2* | 2/2011 | Hellberg | H03F 1/0288 330/124 R |
| 9,319,012 B2* | 4/2016 | Maniwa | H03F 3/245 |

(Continued)

FOREIGN PATENT DOCUMENTS

| | | |
|---|---|---|
| JP | 2007-43305 A | 2/2007 |
| JP | 2015-12578 A | 1/2015 |

(Continued)

OTHER PUBLICATIONS

A Compact Ka/Q Dual-Band GaAs MMIC Doherty Power Amplifier With Simplified Offset Lines for 5G Applications; Guansheng Lv et al., IEEE, Jul. 2019.*
(Continued)

*Primary Examiner* — Khanh V Nguyen
(74) *Attorney, Agent, or Firm* — Birch, Stewart, Kolasch & Birch, LLP

(57) ABSTRACT

A Doherty amplifier includes: a first amplifying element to amplify a first signal; a second amplifying element to amplify a second signal having a phase difference with the first signal; a first transmission line connected to an output terminal of the first amplifying element; and a second transmission line connected to an output terminal of the second amplifying element, wherein the first transmission line and the second transmission line are equal to each other in characteristic impedance, the phase difference between the first signal and the second signal is not equal to a difference in electrical length between the second transmission line and the first transmission line, and the first signal having passed through the first transmission line and the second signal having passed through the second transmission line are subjected to different phase synthesis.

20 Claims, 7 Drawing Sheets

(58) Field of Classification Search
CPC ......... H03F 2200/315; H03F 2200/423; H03F 1/56; H03F 2200/543; H03F 3/68; H03F 3/195
USPC .............................................. 330/124 R, 295
See application file for complete search history.

(56) References Cited

U.S. PATENT DOCUMENTS

| | | | |
|---|---|---|---|
| 9,438,187 B2* | 9/2016 | Yamaoka | ............... H03F 1/0288 |
| 9,531,329 B2* | 12/2016 | Tanimoto | ................ H03F 3/245 |
| 10,250,196 B2* | 4/2019 | Tong | ........................ H01L 24/49 |
| 2009/0206926 A1 | 8/2009 | Horiguchi et al. | |
| 2015/0008983 A1 | 1/2015 | Maniwa et al. | |
| 2017/0373645 A1 | 12/2017 | Jang et al. | |
| 2020/0136564 A1 | 4/2020 | Nakatani et al. | |

FOREIGN PATENT DOCUMENTS

| | | |
|---|---|---|
| JP | 2015-65559 A | 4/2015 |
| WO | WO 2007/015462 A1 | 2/2007 |
| WO | WO 2019/021426 A1 | 1/2019 |

OTHER PUBLICATIONS

Extended European Search Report issued in Application No. EP 20933306.1, dated Apr. 3, 2023.
International Search Report, issued in PCT/JP2020/017949, dated Jul. 28, 2020.
Written Opinion of the International Searching Authority, issued in PCT/JP2020/017949, dated Jul. 28, 2020.
Japanese Notice of Refusal for Japanese Application No. 2022-517142, dated Oct. 21, 2022, with English translation.

* cited by examiner

DOHERTY AMPLIFIER

CROSS REFERENCE TO RELATED APPLICATIONS

This application is a Continuation of PCT International Application No. PCT/JP2020/017949, filed on Apr. 27, 2020, which is hereby expressly incorporated by reference into the present application.

TECHNICAL FIELD

The present disclosure relates to a Doherty amplifier.

BACKGROUND ART

As an amplifier for mobile object communication, an amplifier capable of amplifying a signal having a large peak-to-average power ratio (PAPR) with high efficiency is desired. A Doherty amplifier is known as an amplifier capable of amplifying a signal having a large PAPR with high efficiency. The Doherty amplifier can amplify a signal with high efficiency at an operating point where the backoff amount from the saturation output is large.

For example, a power amplifier described in Patent Literature 1 includes an input branch circuit, an output synthesis circuit, and an output matching circuit. The input branch circuit includes a π-type distributed constant circuit, and distributes an input signal to a main amplifier and an auxiliary amplifier. The output synthesis circuit includes a π-type distributed constant circuit, and synthesizes an output signal of the main amplifier and an output signal of the auxiliary amplifier. The output matching circuit includes a π-type distributed constant circuit, and matches the output synthesis circuit and an output load.

Since the π-type distributed constant circuit exhibits a function equivalent to that of a quarter wavelength transmission line included in the Doherty amplifier, the power amplifier described in Patent Literature 1 has an output backoff-to-power-added efficiency (PAE) characteristic substantially equal to that of the Doherty amplifier, and operates in substantially the same manner as the Doherty amplifier.

CITATION LIST

Patent Literatures

Patent Literature 1: JP 2015-65559 A

SUMMARY OF INVENTION

Technical Problem

The power amplifier described in Patent Literature 1 has a problem that a decrease in efficiency due to a transmission line connected to an output terminal of the auxiliary amplifier being a strong inductive load cannot be suppressed during a load modulation from a backoff point at which the auxiliary amplifier starts operation until the auxiliary power amplifier reaches saturation output power.

The present disclosure addresses the above problem, and an object thereof is to obtain a Doherty amplifier capable of operating with high efficiency from a backoff point to a saturation output.

Solution to Problem

The Doherty amplifier according to the present disclosure includes: a first amplifying element to amplify a first signal; a second amplifying element to amplify a second signal having a phase difference with the first signal; a first transmission line connected to an output terminal of the first amplifying element; and a second transmission line connected to an output terminal of the second amplifying element, wherein the first transmission line and the second transmission line are equal to each other in characteristic impedance, the phase difference between the first signal and the second signal is not equal to a difference in electrical length between the second transmission line and the first transmission line, the first signal having passed through the first transmission line and the second signal having passed through the second transmission line are subjected to different phase synthesis, the electrical length of the first transmission line is within a range from 70 degrees to 90 degrees, the electrical length of the second transmission line is within a range from 90 degrees to 180 degrees, and the characteristic impedance of the first transmission line and the characteristic impedance of the second transmission line are smaller than a value obtained by doubling an external load.

Advantageous Effects of Invention

According to the present disclosure, the characteristic impedance of the first transmission line is equal to the characteristic impedance of the second transmission line, the phase difference between the first signal and the second signal is not equal to the difference in electrical length between the second transmission line and the first transmission line, and the first signal having passed through the first transmission line and the second signal having passed through the second transmission line are subjected to different phase synthesis. The inductivity generated during load modulation from the backoff point to the saturation output is reduced by capacitance generated in a load by the phase difference between the first signal and the second signal. As a result, the Doherty amplifier according to the present disclosure can operate with high efficiency from the backoff point to the saturation output.

DESCRIPTION OF EMBODIMENTS

First Embodiment

Figure 1:
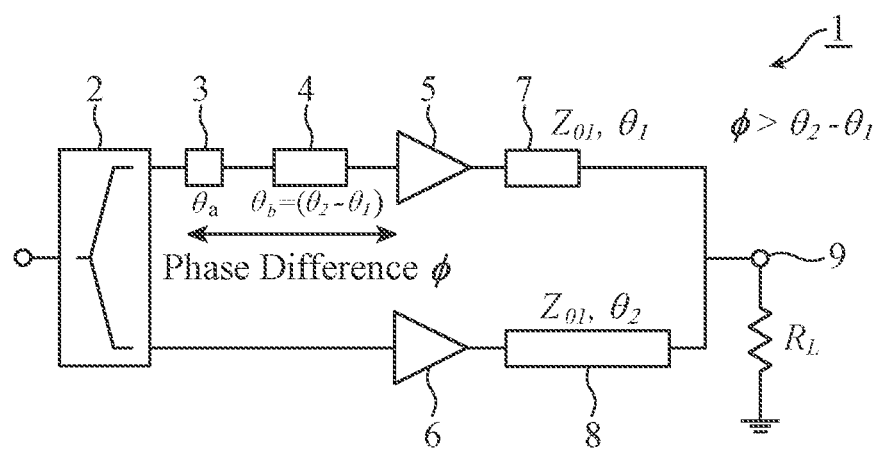
FIG. 1 is a block diagram illustrating a configuration of a Doherty amplifier according to a first embodiment.

FIG. 1 is a block diagram illustrating the configuration of a Doherty amplifier 1 according to a first embodiment. In FIG. 1, the Doherty amplifier 1 includes a divider circuit 2, a first phase adjustment line 3, a second phase adjustment line 4, a first amplifying element 5, a second amplifying element 6, a first transmission line 7, a second transmission line 8, and an output terminal 9.

The divider circuit 2 has a first output terminal and a second output terminal. The first output terminal is connected to an input-side end of the first phase adjustment line 3, and the second output terminal is connected to an input terminal of the second amplifying element 6. The divider circuit 2 divides an input signal input through the input terminal at any division ratio. One of the signals divided by the divider circuit 2 is output to the first phase adjustment line 3 through the first output terminal, and the other signal is output to the second amplifying element 6 through the second output terminal.

The first phase adjustment line 3 is a transmission line having the input-side end connected to the first output terminal of the divider circuit 2 and an output-side end connected to an input-side end of the second phase adjustment line 4. In addition, the first phase adjustment line 3 generates a first delay of a delay amount $\theta_a$ with respect to the input signal. The second phase adjustment line 4 is a transmission line having the input-side end connected to the output-side end of the first phase adjustment line 3 and an output-side end connected to an input terminal of the first amplifying element 5. In addition, the second phase adjustment line 4 generates a second delay of a delay amount $\theta_b$ with respect to the input signal.

A first signal having passed through the first phase adjustment line 3 and the second phase adjustment line 4 is delayed by a delay amount $(\theta_a+\theta_b)$. For the first phase adjustment line 3 and the second phase adjustment line 4, a circuit including a lumped constant element, a circuit including a distributed constant line, or a circuit combining a lumped constant and a distributed constant is used.

The first amplifying element 5 has the input terminal connected to the output-side end of the second phase adjustment line 4 and an output terminal connected to an input-side end of the first transmission line 7, and amplifies the first signal output from the second phase adjustment line 4. The second amplifying element 6 has the input terminal connected to the second output terminal of the divider circuit 2 and an output terminal connected to an input-side end of the second transmission line 8, and amplifies a second signal output from the divider circuit 2.

In the Doherty amplifier 1, the first amplifying element 5 is a main amplifier, and the second amplifying element 6 is an auxiliary amplifier. The first amplifying element 5 and the second amplifying element 6 are amplifiers that use a field effect transistor (FET), a heterojunction bipolar transistor (HBT), or a high electron mobility transistor (HEMT).

The first transmission line 7 includes the input-side end connected to the output terminal of the first amplifying element 5 and an output-side end connected to the output terminal 9, and has a characteristic impedance $Z_{01}$ and an electrical length $\theta_1$. In the first transmission line 7, a load seen from the first amplifying element 5 is modulated.

The second transmission line 8 includes the input-side end connected to the output terminal of the second amplifying element 6 and an output-side end connected to the output terminal 9, and has an electrical length $\theta_2$ and a characteristic impedance $Z_{01}$ equal to the characteristic impedance of the first transmission line 7. In the second transmission line 8, a load seen from the second amplifying element 6 is modulated.

The output terminal 9 is an output combining point at which the first signal having passed through the first transmission line 7 and the second signal having passed through the second transmission line 8 are subjected to different phase synthesis and output. An external load $R_L$ is a grounded resistor, and connected to the output terminal 9.

In the Doherty amplifier 1, the output terminal of the first amplifying element 5, the output terminal 9, and the output terminal of the second amplifying element 6 are not isolated. The first amplifying element 5 is biased to operate, for example, at class A or class AB, and the second amplifying element 6 is biased to operate, for example, at class C. In addition, the electrical characteristics of the first amplifying element 5 and the second amplifying element 6 are the same.

The operation of the Doherty amplifier 1 is as follows.

First, the signal input to the input terminal of the divider circuit 2 is divided at any division ratio. One of the signals divided by the divider circuit 2 is output to the first phase adjustment line 3, and the other signal is output to the second amplifying element 6. The signal having passed through the first phase adjustment line 3 is delayed by a delay amount $\theta_a$. The signal that has passed through the first phase adjustment line 3 is output to the second phase adjustment line 4. The signal having passed through the second phase adjustment line 4 is further delayed by a delay amount $\theta_b$.

The other signal divided by the divider circuit 2 is input to the input terminal of the second amplifying element 6 without any delay. The first signal that has passed through the second phase adjustment line 4 and been input to the first amplifying element 5 is delayed by a delay amount $\varphi(=\theta_a+\theta_b)$, so that a phase difference $\varphi$ occurs between the first signal input to the first amplifying element 5 and the second signal input to the second amplifying element 6. The phase difference $\varphi$ is constant regardless of, for example, the power level of the input signal.

In the operating state up to the backoff point, the power of the second signal input to the second amplifying element 6 is sufficiently small, and thus, the second amplifying element 6 is in an off state. The output terminal of the second amplifying element 6 in the off state can be regarded as open. The first amplifying element 5 amplifies the first signal output from the second phase adjustment line 4 and outputs the amplified first signal from the output terminal.

Figure 2:
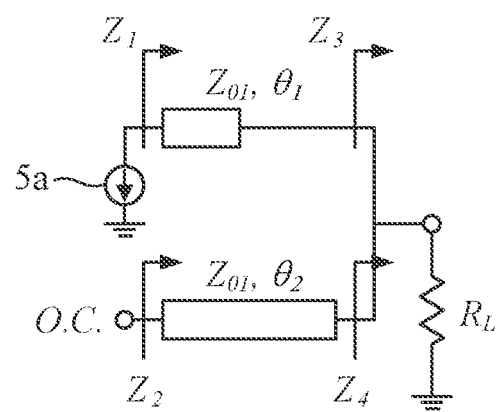
FIG. 2 is a circuit diagram illustrating an equivalent circuit of the Doherty amplifier during an operation up to a backoff point.

FIG. 2 is a circuit diagram illustrating an equivalent circuit of the Doherty amplifier 1 during an operation up to a backoff point. In FIG. 2, a first current source 5a represents a current output from the first amplifying element 5. In addition, a load $Z_1$ indicates a load on the output side seen from the output terminal of the first amplifying element 5, a load $Z_2$ indicates a load on the output side seen from the output terminal of the second amplifying element 6, a load $Z_3$ indicates a load on the output side seen from the output end of the first transmission line 7, and a load $Z_4$ indicates a load on the output side seen from the output end of the second transmission line 8.

In a case where the output terminal of the second amplifying element 6 is open, the electrical length $\theta_1$ of the first transmission line 7 and the electrical length $\theta_2$ of the second transmission line 8 satisfy the relationship expressed by following Formula (1).

$$\tan(2\theta_1) = \frac{4R_L^2 Z_{01}\sin(2\theta_2)}{2Z_{01}^2(\cos(2\theta_2)+1) - 4R_L^2\cos(2\theta_2)} \quad (1)$$

Figure 3:
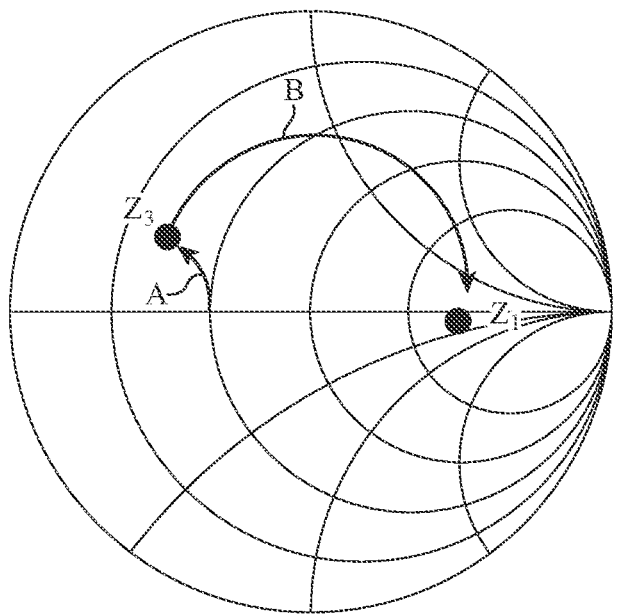
FIG. 3 is a Smith chart illustrating a load on an output side seen from an output terminal of a first transmission line and a load on the output side seen from an output terminal of a first amplifying element in the Doherty amplifier during the operation up to the backoff point.

FIG. 3 is a Smith chart illustrating a load on the output side seen from the output terminal of the first transmission line 7 and a load on the output side seen from the output terminal of the first amplifying element 5 in the Doherty amplifier 1 during the operation up to the backoff point. For example, the electrical length $\theta_1$ of the first transmission line 7 is within a range from 70 degrees to 90 degrees, and the electrical length $\theta_2$ of the second transmission line 8 is within a range from 90 degrees to 180 degrees. Thus, the electrical lengths are different from each other. Therefore, when the second amplifying element 6 is in the off state, the second transmission line 8 operates as an inductive stub. The external load $R_L$ connected to the output terminal 9 is transformed into the load $Z_3$ as indicated by an arrow A. The first transmission line 7 transforms the load $Z_3$ into the load $Z_1$ as indicated by an arrow B. The load $Z_1$ is transformed to turn into a load on the real axis by the characteristic impedance $Z_{01}$ and the electrical length $\theta_1$ of the first transmission line 7.

In the Doherty amplifier 1 during operation up to the backoff point, $Z_1$ can be represented by $Z_1 = Z_{opt\_bo}$ where $Z_{opt\_bo}$ is a design target load for the load $Z_1$ which is a characteristic impedance on the output side seen from the output terminal of the first amplifying element 5. The first amplifying element 5 outputs power corresponding to the load $Z_1$. During the operation up to the backoff point, the load $Z_1$ is higher than the load $Z_1$ having reached the saturation output. Therefore, in the Doherty amplifier 1 during the operation up to the backoff point, a high load is connected to the first amplifying element 5, and the Doherty amplifier 1 can operate with low output and high efficiency.

During the operation from the backoff point to the saturation output, the power of the second signal input to the second amplifying element 6 is large enough to turn on the second amplifying element 6. The first amplifying element 5 amplifies the first signal output from the second phase adjustment line 4 and outputs the amplified first signal from the output terminal. Due to the delay generated while the first signal and the second signal pass through the first phase adjustment line 3 and the second phase adjustment line 4, respectively, a phase difference $\varphi$ (=$\theta_a + \theta_b$) is generated between the first signal amplified by the first amplifying element 5 and the second signal amplified by the second amplifying element 6.

Figure 4:
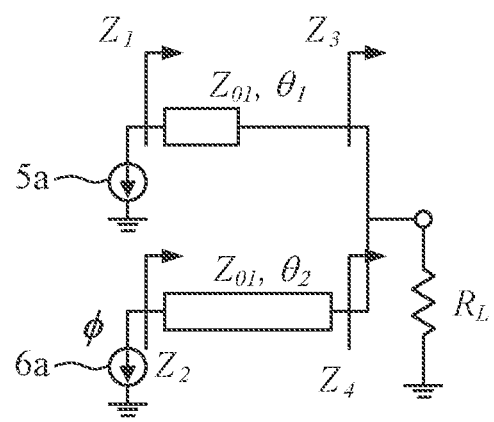
FIG. 4 is a circuit diagram illustrating an equivalent circuit of the Doherty amplifier during an operation from a backoff point to a saturation output.

FIG. 4 is a circuit diagram illustrating an equivalent circuit of the Doherty amplifier 1 during the operation from the backoff point to the saturation output. In FIG. 4, the first current source 5a represents a current output from the first amplifying element 5 as in FIG. 2. A second current source 6a represents a current output from the second amplifying element 6. The current from the second current source 6a has a leading phase $\varphi$ as compared with the current from the first current source 5a.

In the Doherty amplifier 1, the phase difference $\varphi$ is selected so as not to be equal to the difference ($\theta_2 - \theta_1$) between the electrical length $\theta_1$ of the first transmission line 7 and the electrical length $\theta_2$ of the second transmission line 8. Note that a relationship represented by Formula (2) below is established among the phase difference $\varphi$, the characteristic impedance $Z_{01}$, the electrical length $\theta_1$, the electrical length $\theta_2$, and the external load $R_L$. For example, the electrical length $\theta_1$ of the first transmission line 7 is within a range from 70 degrees to 90 degrees, the electrical length $\theta_2$ of the second transmission line 8 is within a range from 90 degrees to 180 degrees, and the characteristic impedance $Z_{01}$ of the first transmission line 7 and the characteristic impedance $Z_{01}$ of the second transmission line 8 are smaller than a value obtained by doubling the external load $R_L$.

$$\cos(\varphi) = \frac{-2K_1 K_3 \pm \sqrt{(2K_1 K_3)^2 - 4(K_1^2 - K_3^2)(K_3^2 + K_3^2)}}{2(K_3^2 + K_2^2)} \quad (2)$$

$K_1 =$
$Z_{01}\left((Z_{01}^2\cos(\theta_2 + \theta_1) + Z_{01}^2\cos(\theta_2 - \theta_1))(Z_{01}^2\sin(\theta_2 + \theta_1) - Z_{01}^2\sin(\theta_2 - \theta_1)) - \right.$
$\left. 4R_L^2 Z_{01}^2\cos(\theta_2 + \theta_1)\sin(\theta_2 + \theta_1)\right)$ $K_2 = 2R_L Z_{01}^4\{\cos(\theta_2 + \theta_1) + \cos(\theta_2 - \theta_1)\}$ $K_3 = -4R_L^2 Z_{01}^3 \sin(\theta_2 + \theta_1)$ In the Doherty amplifier 1 during the operation from the backoff point to the saturation output, the load $Z_1$ on the input-side end of the first transmission line 7 seen from the output terminal of the first amplifying element 5, the load $Z_2$ on the input-side end of the second transmission line seen from the output terminal of the second amplifying element 6, the load $Z_3$ on the same side as the output terminal 9 seen from the output terminal of the first transmission line 7, and the load $Z_4$ on the same side as the output terminal 9 seen from the output terminal of the second transmission line 8 are modulated depending on an output power ratio between the first amplifying element 5 and the second amplifying element 6.

The load $Z_1$ is subjected to load modulation from $Z_1 = Z_{1bo\_opt}$ to $Z_1 = Z_{p\_opt}$ during the operation up to the backoff point. In addition, the load $Z_2$ turns into a saturation output state from the open state during the operation up to the backoff point, so that the load $Z_2$ is subjected to load modulation of $Z_2 = Z_{2p}$. When the magnitude of a current $I_2$ output from the second amplifying element 6 falls within a range of $0 < I_2 \le 1$ in a case where the magnitude of a current $I_1$ output from the first amplifying element 5 and the magnitude of the current $I_2$ output from the second amplifying element 6 are set to, for example, 1 at the time of the saturation output, the above-described load modulation occurs.

Figure 5:
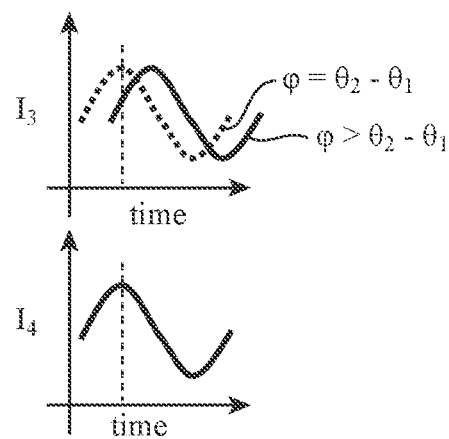
FIG. 5 is a graph illustrating a relationship between a current output from the first transmission line and a current output from a second transmission line in the Doherty amplifier during the operation from the backoff point to the saturation output.

FIG. 5 is a graph illustrating the relationship between a current $I_3$ output from the first transmission line 7 and a current $I_4$ output from the second transmission line 8 in the Doherty amplifier 1 during the operation from the backoff point to the saturation output. In a case where $\varphi>(\theta_2-\theta_1)$ is established, that is, the phase difference $\varphi$ between the first signal and the second signal is larger than the difference between the electrical length $\theta_2$ of the second transmission line 8 and the electrical length $\theta_1$ of the first transmission line 7, the current $I_4$ has a relatively leading phase with respect to the current $I_3$ as illustrated in FIG. 5, so that the current $I_4$ has a capacitive component. In addition, when $\varphi<(\theta_2-\theta_1)$, the current $I_4$ has an inductive component. Therefore, the Doherty amplifier 1 can freely set the reactance component of the output circuit by the phase difference $\varphi$.

Figure 6:
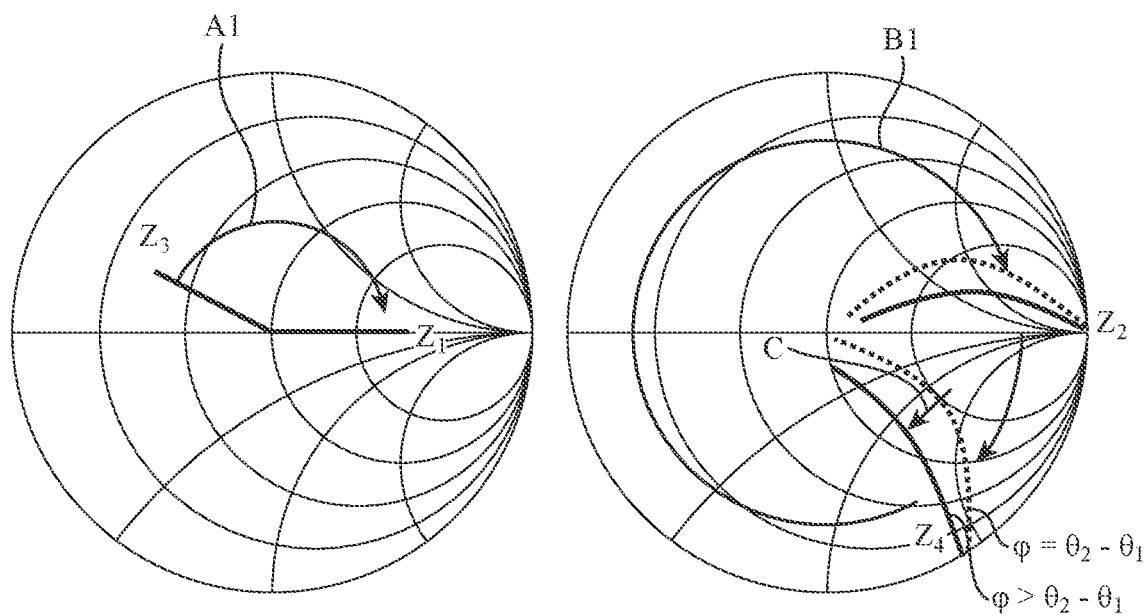
FIG. 6 is a Smith chart illustrating a load modulation trajectory in the Doherty amplifier during the operation from the backoff point to the saturation output ($\varphi > (\theta_2 - \theta_1)$).

FIG. 6 is a Smith chart illustrating a load modulation trajectory in the Doherty amplifier 1 during the operation from the backoff point to the saturation output. As indicated by an arrow A1, the load $Z_3$ is transformed into the load $Z_1$ depending on the characteristic impedance $Z_{01}$ and the electrical length $\theta_1$ of the first transmission line 7. Capacitance is generated in the load $Z_4$ on the same side as the output terminal 9 seen from the output-side end of the second transmission line 8 by the phase difference $\varphi$ between the current $I_3$ and the current $I_4$. Since the capacitance generated in the load $Z_4$ is caused by the phase difference $\varphi$, the capacitance is generated only during the operation from the backoff point at which the second amplifying element 6 is turned on to the saturation output.

As indicated by an arrow B1, the load $Z_4$ is transformed into the load $Z_2$ depending on the characteristic impedance $Z_{01}$ and the electrical length $\theta_2$ of the second transmission line 8. In a case where the phase difference $\varphi$ between the first signal and the second signal is represented by $\varphi \neq (\theta_2-\theta_1)$, that is, not equal to the difference in electrical length between the second transmission line 8 and the first transmission line 7 such as, for example, $\varphi>(\theta_2-\theta_1)$, the load when $\varphi=(\theta_2-\theta_1)$ indicated by the broken line is transformed to the load $Z_4$ as indicated by an arrow C with the capacitive component being set. As a result, the inductive component generated in the load $Z_2$ is smaller than that when $\varphi=(\theta_2-\theta_1)$.

In a case where the Doherty amplifier 1 is in a saturation output state due to the characteristic impedance $Z_{01}$, the electrical length $\theta_1$, the electrical length $\theta_2$, the phase difference $\varphi$, and the external load $R_L$ satisfying the relationships represented by Formula (1) and Formula (2) above, the load $Z_1$ is turned into a load on the real axis.

In a case where the Doherty amplifier 1 is in a saturated output state and the design target load of the first amplifying element 5 and the second amplifying element 6 is $Z_{opt\_p}$, $Z_1=Z_{opt\_p}$ is established regarding the load $Z_1$, so that the saturation output of the first amplifying element 5 is obtained. On the other hand, due to $\varphi \neq (\theta_2-\theta_1)$, $Z_2 \neq Z_{opt\_p}$ is established regarding the load $Z_2$. In this case, the saturation output from the second amplifying element 6 decreases depending on the mismatch amount between $Z_2$ and $Z_{opt\_p}$. Since $Z_{opt\_p} < Z_{1opt\_bo}$, the output power of the first amplifying element 5 when the Doherty amplifier 1 is in a saturation output state is larger than the output power up to the backoff point. Therefore, the Doherty amplifier 1 operates with high efficiency with larger output power as compared with the operation process up to the backoff point.

Figure 7:
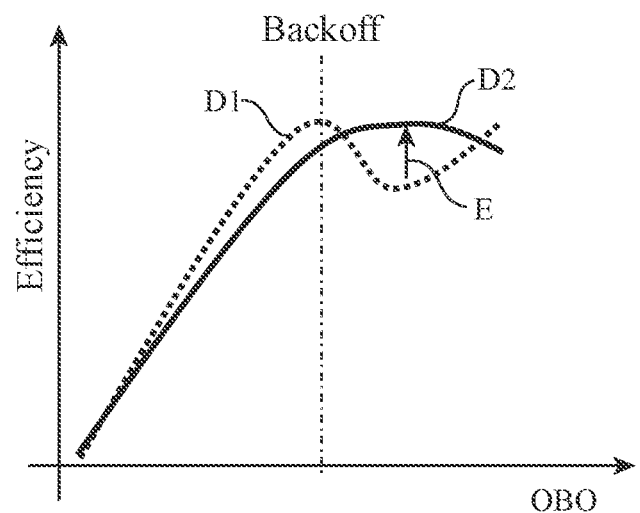
FIG. 7 is a graph illustrating a relationship of efficiency with respect to a backoff amount of the Doherty amplifier.

FIG. 7 is a graph illustrating a relationship of efficiency with respect to a backoff amount of the Doherty amplifier 1, and illustrates a change in efficiency with respect to the backoff amount (OBO) of the Doherty amplifier 1. In FIG. 7, a broken line D1 indicates a change in efficiency with respect to the OBO in a comparative Doherty amplifier having the same configuration as that of the Doherty amplifier 1 except that $\varphi=(\theta_2-\theta_1)$, and a solid line D2 indicates a change in efficiency with respect to the OBO in the Doherty amplifier 1. In the Doherty amplifier 1, the inductivity generated in the load during the operation from the backoff point to the saturation output is reduced, and thus, the efficiency is improved as indicated by an arrow E.

Figure 8:
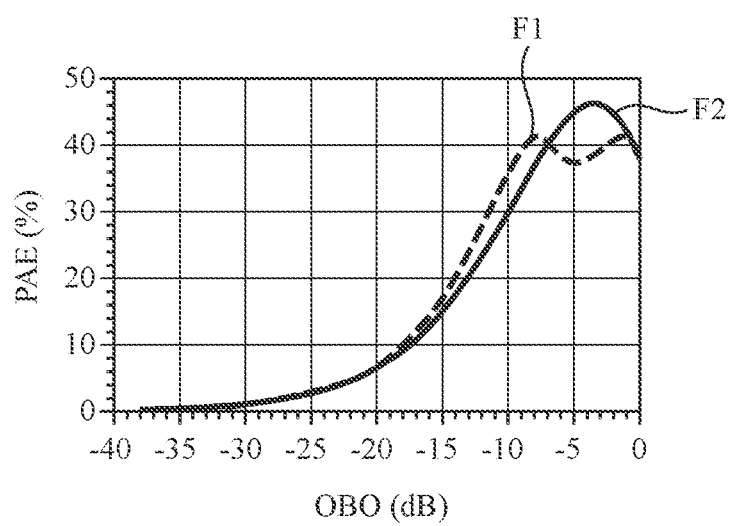
FIG. 8 is a graph illustrating a simulation result of a power added efficiency with respect to the backoff amount of the Doherty amplifier.

FIG. 8 is a graph illustrating a simulation result of the power added efficiency (PAE) with respect to the backoff amount (OBO) of the Doherty amplifier 1. In FIG. 8, a broken line F1 indicates a change in PAE with respect to OBO in a comparative Doherty amplifier having the same configuration as the configuration of the Doherty amplifier 1 except that $\varphi=(\theta_2-\theta_1)$, and a solid line F2 indicates a change in PAE with respect to OBO in the Doherty amplifier 1. In the Doherty amplifier 1, the inductivity generated in the load during the operation from the backoff point to the saturation output is reduced, and thus, the PAE is improved.

Figure 9:
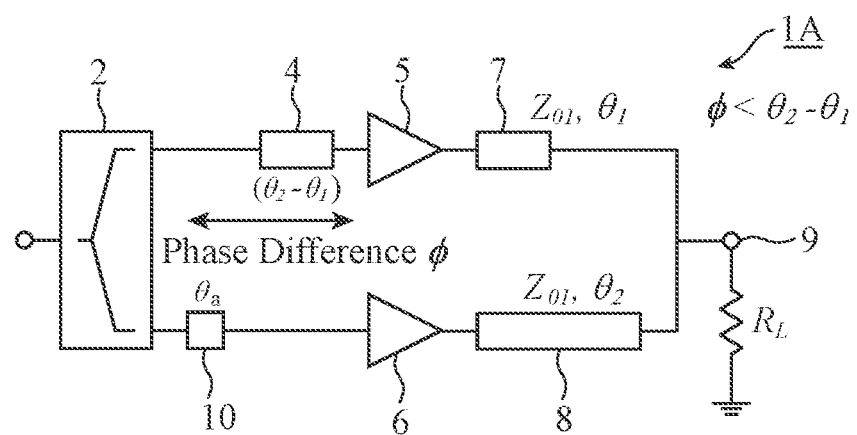
FIG. 9 is a block diagram illustrating a configuration of a modification of the Doherty amplifier according to the first embodiment.

FIG. 9 is a block diagram illustrating a configuration of a Doherty amplifier 1A which is a modification of the Doherty amplifier 1. In FIG. 9, the Doherty amplifier 1A includes a divider circuit 2, a second phase adjustment line 4, a first amplifying element 5, a second amplifying element 6, a first transmission line 7, a second transmission line 8, an output terminal 9, and a third phase adjustment line 10.

In the Doherty amplifier 1A, the divider circuit 2 has a first output terminal and a second output terminal. The first output terminal is connected to an input-side end of the second phase adjustment line 4, and the second output terminal is connected to an input-side end of the third phase adjustment line 10. The divider circuit 2 divides an input signal input through the input terminal at any division ratio. One of the signals divided by the divider circuit 2 is output to the second phase adjustment line 4 through the first output terminal, and the other signal is output to the third phase adjustment line 10 through the second output terminal.

The second phase adjustment line 4 generates a delay of a delay amount $\theta_b$ ($=\theta_2-\theta_1$) with respect to the signal input from the divider circuit 2 through the input-side end. The third phase adjustment line 10 is a transmission line having the input-side end connected to the output terminal of the divider circuit 2 and an output-side end connected to an input terminal of the second amplifying element 6. The third phase adjustment line 10 generates a delay of a delay amount $\theta_a$ with respect to the signal input from the divider circuit 2 through the input-side end.

Figure 10:
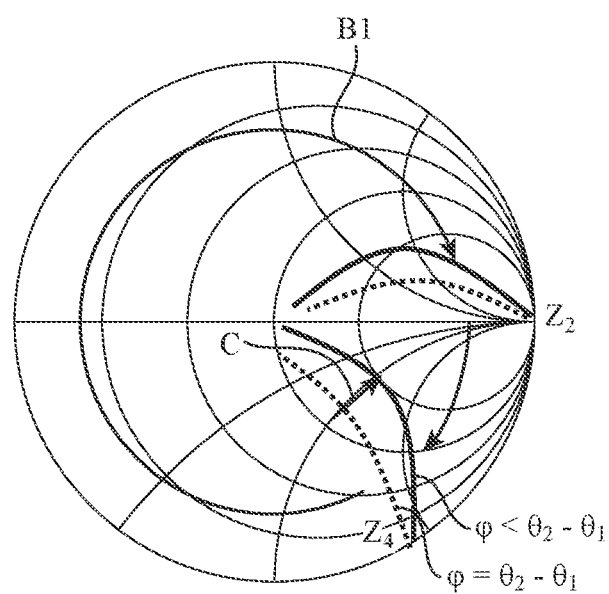
FIG. 10 is a Smith chart illustrating a load modulation trajectory in the Doherty amplifier during an operation from a backoff point to a saturation output ($\varphi<(\theta_2-\theta_1)$).

The output terminal of the first amplifying element 5 is connected to an input-side end of the first transmission line 7, and an output-side end of the first transmission line 7 is connected to the output terminal 9. An output terminal of the second amplifying element 6 is connected to an input-side end of the second transmission line 8, and an output-side end of the second transmission line 8 is connected to the output terminal 9. The Doherty amplifier 1A is designed so that $\varphi<(\theta_2-\theta_1)$ is established. Due to $\varphi<(\theta_2-\theta_1)$, the Doherty amplifier 1A can freely set the reactance component of the output circuit by the phase difference $\varphi$. FIG. 10 is a Smith chart illustrating a load modulation trajectory in the Doherty amplifier 1A during an operation from the backoff point to the saturation output. In FIG. 10, a load $Z_4$ is transformed into a load $Z_2$ depending on a characteristic impedance $Z_{01}$ and an electrical length $\theta_2$ of the second transmission line 8 as indicated by an arrow B1. In a case where the phase difference $\varphi$ between the first signal and the second signal is represented by $\varphi$ ($\theta_2-\theta_1$), that is, not equal to the difference in electrical length between the second transmission line 8 and the first transmission line 7 such as, for example, $\varphi<(\theta_2-\theta_1)$, the load when $\varphi=(\theta_2-\theta_1)$ indicated by the broken line is transformed to the load $Z_4$ as indicated by an arrow C with the inductive component being set. As a result, the inductive component generated in the load $Z_2$ when $\varphi < (\theta_2 - \theta_1)$ is larger than that when $\varphi = (\theta_2 - \theta_1)$.

As described above, in the Doherty amplifier 1 or 1A according to the first embodiment, the characteristic impedance $Z_{01}$ of the first transmission line 7 is equal to the characteristic impedance $Z_{01}$ of the second transmission line 8, the phase difference $\varphi$ between the first signal and the second signal is not equal to the difference $(\theta_2 - \theta_1)$ in electrical length between the second transmission line 8 and the first transmission line 7, and the first signal having passed through the first transmission line 7 and the second signal having passed through the second transmission line 8 are subjected to different phase synthesis. The inductivity generated in the load during load modulation from the backoff point to the saturation output is reduced by the capacitance generated in the load by the phase difference $\varphi$ between the first signal and the second signal. As a result, the Doherty amplifier 1 can operate with high efficiency from the backoff point to the saturation output.

Second Embodiment

Figure 11:
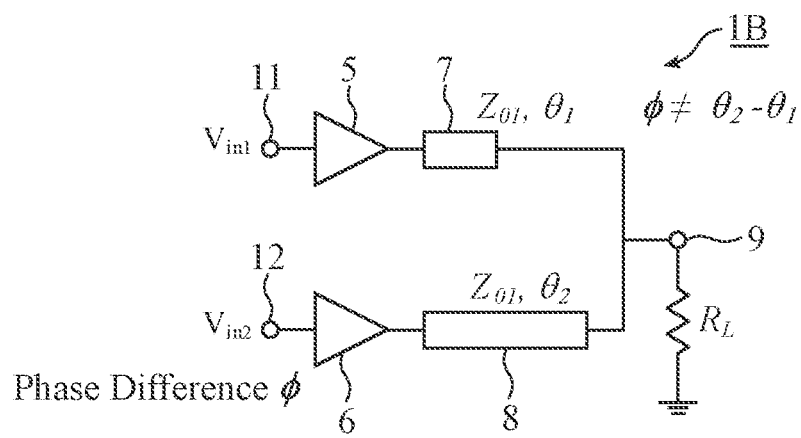
FIG. 11 is a block diagram illustrating a configuration of a Doherty amplifier according to a second embodiment.

FIG. 11 is a block diagram illustrating a Doherty amplifier 1B according to a second embodiment. In FIG. 11, the Doherty amplifier 1B includes a first amplifying element 5, a second amplifying element 6, a first transmission line 7, a second transmission line 8, an output terminal 9, a first input terminal 11, and a second input terminal 12. The first input terminal 11 is connected to an input terminal of the first amplifying element 5, and the second input terminal 12 is connected to an input terminal of the second amplifying element 6.

The first amplifying element 5 has an output terminal connected to an input-side end of the first transmission line 7, and amplifies a first signal input through the first input terminal 11. The second amplifying element 6 has an output terminal connected to an input-side end of the second transmission line 8, and amplifies a second signal input through the second input terminal 12.

The first transmission line 7 includes the input-side end connected to the output terminal of the first amplifying element 5 and an output-side end connected to the output terminal 9, and has a characteristic impedance $Z_{01}$ and an electrical length $\theta_1$. The first transmission line 7 modulates a load seen from the first amplifying element 5.

The second transmission line 8 includes the input-side end connected to the output terminal of the second amplifying element 6 and an output-side end connected to the output terminal 9, and has an electrical length $\theta_2$ and a characteristic impedance $Z_{01}$ equal to the characteristic impedance of the first transmission line 7. The second transmission line 8 modulates a load seen from the second amplifying element 6.

The output terminal 9 is an output combining point at which the first signal having passed through the first transmission line 7 and the second signal having passed through the second transmission line 8 are subjected to different phase synthesis and output. An external load $R_L$ is a grounded resistor, and connected to the output terminal 9.

A phase difference $\varphi$ is given between the first signal input through the first input terminal 11 and the second signal input through the second input terminal 12. In the Doherty amplifier 1B during the operation from a backoff point to a saturation output, the ratio between a voltage amplitude $V_{in1}$ of the first signal and a voltage amplitude $V_{in2}$ of the second signal is not constant, and the value thereof changes with a threshold $V_{th}$ as a boundary.

During the operation until the Doherty amplifier 1B reaches the backoff point, the voltage amplitude $V_{in1}$ of the first signal has a value within a range of $0 < V_{in1} < V_{th}$, and the voltage amplitude $V_{in2}$ of the second signal has a value small enough to turn off the second amplifying element 6. That is, the threshold $V_{th}$ corresponds to a value of the voltage amplitude $V_{in1}$ of the first signal when the first amplifying element 5 reaches the maximum efficiency during the operation of the Doherty amplifier 1B up to the backoff point.

In the Doherty amplifier 1B during the operation from the backoff point to the saturation output, the voltage amplitude $V_{in2}$ of the second signal starts to rise when the voltage amplitude $V_{in1}$ of the first signal satisfies $V_{in1} > V_{th}$. When the first amplifying element 5 reaches the saturation output, the magnitude of the voltage amplitude $V_{in1}$ of the first signal is equal to the magnitude of the voltage amplitude $V_{in2}$ of the second signal.

In the Doherty amplifier 1B during the operation up to the backoff point, the ratio between the voltage amplitude $V_{in1}$ of the first signal and the voltage amplitude $V_{in2}$ of the second signal is controlled in such a manner that only the first amplifying element 5 is driven and the second amplifying element 6 is turned off. As a result, the power consumption of the second amplifying element 6 during the operation up to the backoff point is reduced, and the efficiency is improved.

For example, in a case where a gain and a saturation current are equal between the first amplifying element 5 and the second amplifying element 6, and the magnitude of the voltage amplitude $V_{in1}$ of the first signal when the first amplifying element 5 reaches the saturation output is 1, the threshold $V_{th}$ can be expressed by Formula (3) below. $Z_{1bo\_opt}$ is a load at the input-side end of the first transmission line 7 seen from the output terminal of the first amplifying element 5 in the Doherty amplifier 1B during the operation up to the backoff point. $Z_{p\_opt}$ is a load subjected to load modulation from $Z_{1bo\_opt}$ in the Doherty amplifier 1B during the operation from the backoff point to the saturation output.

$$v_{th} = \frac{Z_{p\_opt}}{Z_{1bo\_opt}} \tag{3}$$

Figure 12:
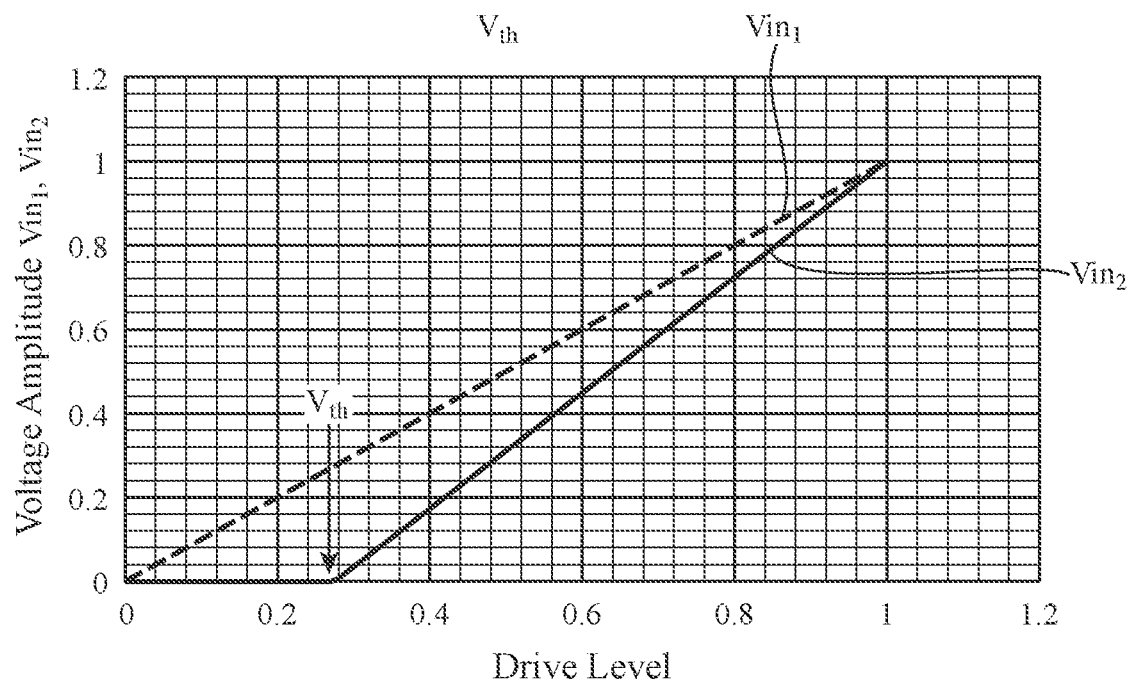
FIG. 12 is a graph illustrating an amplitude ratio of input signals of the Doherty amplifier according to the second embodiment.

FIG. 12 is a graph illustrating an amplitude ratio of input signals of the Doherty amplifier 1B. In FIG. 12, the voltage amplitudes $V_{in1}$ and $V_{in2}$ are normalized using the magnitude of the voltage amplitude Vail of the first signal when the first amplifying element 5 reaches the saturation output as 1. During the operation from the backoff point to the saturation output, when the voltage amplitude $V_{in1}$ of the first signal is equal to or larger than the threshold $V_{th}$, the second amplifying element 6 is turned on, so that the voltage amplitude $V_{in2}$ of the second signal starts to rise, and $V_{in2} = 1$ is established when $V_{in1} = 1$. That is, the ratio between the voltage amplitude $V_{in1}$ and the voltage amplitude $V_{in2}$ approaches asymptotically 1 as the output power levels (drive levels) of the first amplifying element 5 and the second amplifying element 6 increase.

Note that, for the sake of simplicity of explanation, FIG. 12 illustrates a case where the voltage amplitude $V_{in1}$ of the first signal and the voltage amplitude $V_{in2}$ of the second signal change in accordance with a first-order linear straight line. However, the actual amplifying element does not have a linear characteristic with respect to the input voltage. Therefore, the change in the voltage amplitude $V_{in1}$ of the first signal and the voltage amplitude $V_{in2}$ of the second signal may be expressed by, for example, a high-order curve or a tanh function, or a table of $V_{in2}$ may be prepared for $V_{in1}$.

Although the case where the drive level of the second amplifying element 6 at which the voltage amplitude $V_{in2}$ of the second signal rises is the threshold $V_{th}$ is illustrated, a deviation depending on a variation in the gain or the saturation current of the amplifying element is given to the threshold $V_{th}$. For example, any value of $V_{th} \times \pm 20\%$, $V_{th} \times \pm 10\%$, $V_{th} \times \pm 5\%$, or $V_{th} \times \pm 1\%$ may be set as the threshold depending on the variation in the gain or the saturation current of the amplifying element. In FIG. 12, the voltage amplitude $V_{in2}$ may have a value to which a deviation is given such as $V_{in2} \times \pm 20\%$, $V_{in2} \times \pm 10\%$, $V_{in2} \times \pm 5\%$, or $V_{in2} \times \pm 1\%$ depending on the input power level, or may be expressed by a high-order curve or a tanh function.

The above description is based on the premise that the passing phase of the first amplifying element 5 is equal to the passing phase of the second amplifying element 6, but actually, there are few cases where the passing phases of two different amplifying elements are equal. In view of this, in the Doherty amplifier 1B, in a case where the passing phase of the first amplifying element 5 and the passing phase of the second amplifying element 6 are different from each other, a phase difference that compensates for a difference between the passing phase of the first amplifying element 5 and the passing phase of the second amplifying element 6 is given to the signals input to the first amplifying element 5 and the second amplifying element 6. As a result, the Doherty amplifier 1B can operate with high efficiency.

Figure 13:
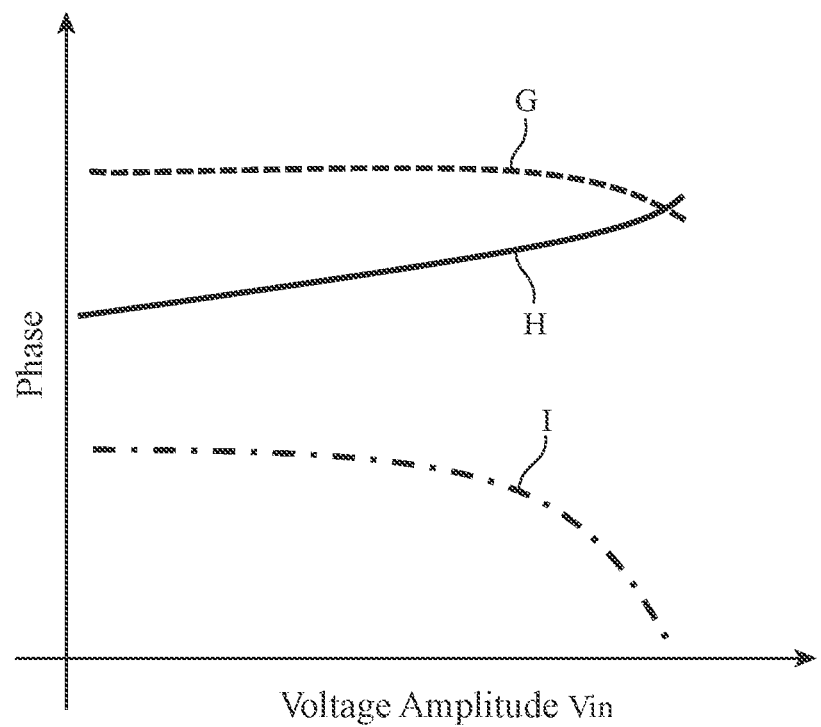
FIG. 13 is a graph illustrating a phase difference of input signals of the Doherty amplifier according to the second embodiment.

FIG. 13 is a graph illustrating a phase difference of the input signals of the Doherty amplifier 1B, and illustrates the relationship between the voltage amplitude Vin of the signal and the phase of the signal. As illustrated in FIG. 13, a phase difference I between a passing phase G of the second amplifying element 6 and a passing phase H of the first amplifying element 5 is added to the phase of the first signal depending on the power level (voltage amplitude $V_{in1}$) of the first signal.

In this manner, a phase difference that compensates for a difference between the passing phase of the first amplifying element 5 and the passing phase of the second amplifying element 6 is provided between the first signal input to the first amplifying element 5 and the second signal input to the second amplifying element 6. For example, the phase difference between the second signal input to the second amplifying element 6 and the first signal input to the first amplifying element 5 is within a range from 45 degrees to 90 degrees.

In the above description, the phase difference between the first signal passing through the first transmission line 7 and the second signal passing through the second transmission line 8 is constant regardless of the input power level. In the Doherty amplifier 1B, the phase difference φ between the first signal and the second signal may be a value having a variation in any range of ±20%, ±10%, ±5%, or ±1% depending on the input power level.

As described above, the Doherty amplifier 1B according to the second embodiment controls the ratio of the voltage amplitude between the first signal input to the first amplifying element 5 and the second signal input to the second amplifying element 6, so that the voltage amplitude $V_{in2}$ of the second signal is 0 when the voltage amplitude $V_{in1}$ of the first signal is equal to or less than the threshold $V_{th}$, and increases when the voltage amplitude $V_{in1}$ of the first signal is larger than the threshold $V_{th}$. As a result, the power consumption of the second amplifying element 6 during the operation up to the backoff point is reduced, and thus, the efficiency is improved.

It is to be noted that the above embodiments can be freely combined, or any component in the embodiments can be modified or omitted.

INDUSTRIAL APPLICABILITY

The Doherty amplifier according to the present disclosure can be used for, for example, an amplifier included in a mobile object communication base station.

REFERENCE SIGNS LIST 1, 1A, 1B: Doherty amplifier, 2: Divider circuit, 3: First phase adjustment line, 4: Second phase adjustment line, 5: First amplifying element, 5a: First current source, 6: Second amplifying element, 6a: Second current source, 7: First transmission line, 8: Second transmission line, 9: Output terminal, 10: Third phase adjustment line, 11: First input terminal, 12: Second input terminal

What is claimed is:

1. A Doherty amplifier comprising:
a first amplifying element to amplify a first signal;
a second amplifying element to amplify a second signal having a phase difference with the first signal;
a first transmission line connected to an output terminal of the first amplifying element; and
a second transmission line connected to an output terminal of the second amplifying element, wherein
the first transmission line and the second transmission line are equal to each other in characteristic impedance,
the phase difference between the first signal and the second signal is not equal to a difference in electrical length between the second transmission line and the first transmission line, the phase difference between the first signal and the second signal being constant regardless of input power levels of the first amplifying element and the second amplifying element,
the first signal having passed through the first transmission line and the second signal having passed through the second transmission line are subjected to different phase synthesis,
the electrical length of the first transmission line is within a range from 70 degrees to 90 degrees,
the electrical length of the second transmission line is within a range from 90 degrees to 180 degrees, and
each of respective values of the characteristic impedance of the first transmission line and the characteristic impedance of the second transmission line is smaller than double the value of a resistance of an external load.

2. The Doherty amplifier according to claim 1, wherein a ratio of a voltage amplitude of the first signal input to the first amplifying element and a voltage amplitude of the second signal input to the second amplifying element is controlled in order that the voltage amplitude of the second signal input to the second amplifying element is 0 when the voltage amplitude of the first signal input to the first amplifying element is equal to or less than a threshold, and rises when the voltage amplitude of the first signal input to the first amplifying element is larger than the threshold.

3. The Doherty amplifier according to claim 2, wherein the ratio of the voltage amplitude of the first signal to the voltage amplitude of the second signal approaches asymptotically 1 with an increase in output power levels of the first amplifying element and the second amplifying element.

4. The Doherty amplifier according to claim 2, wherein the phase difference between the first signal and the second signal has a value having a variation in a range of ±20%.

5. The Doherty amplifier according to claim 1, wherein a phase difference between a signal output from the first amplifying element and a signal output from the second amplifying element is constant regardless of input power levels of the first amplifying element and the second amplifying element.

6. The Doherty amplifier according to claim 1, further comprising:
a divider circuit to divide an input signal;
a first phase adjustment line to generate a first delay for the signal divided by the divider circuit; and
a second phase adjustment line to further generate a second delay for the signal having passed through the first phase adjustment line, wherein
a sum of passing phases of the first phase adjustment line and the second phase adjustment line is equal to the phase difference between the first signal and the second signal.

7. The Doherty amplifier according to claim 1, wherein the phase difference between the first signal and the second signal is larger than a difference in electrical length between the second transmission line and the first transmission line.

8. The Doherty amplifier according to claim 6, wherein the phase difference between the first signal and the second signal is larger than a difference in electrical length between the second transmission line and the first transmission line.

9. The Doherty amplifier according to claim 1, wherein the phase difference between the first signal and the second signal is smaller than a difference in electrical length between the second transmission line and the first transmission line.

10. The Doherty amplifier according to claim 6, wherein the phase difference between the first signal and the second signal is smaller than a difference in electrical length between the second transmission line and the first transmission line.

11. The Doherty amplifier according to claim 1, wherein a phase difference between the second signal input to the second amplifying element and the first signal input to the first amplifying element is within a range from 45 degrees to 90 degrees.

12. A Doherty amplifier comprising:
a first amplifying element to amplify a first signal;
a second amplifying element to amplify a second signal having a phase difference with the first signal;
a first transmission line connected to an output terminal of the first amplifying element; and
a second transmission line connected to an output terminal of the second amplifying element,
an output combining point for connecting the Doherty amplifier to an external load at which the first signal having passed through the first transmission line and the second signal having passed through the second transmission line are subjected to different phase synthesis and combined for direct outputting to the external load, wherein the first transmission line and the second transmission line are equal to each other in characteristic impedance,
the phase difference between the first signal and the second signal is configured to be selected so as not to be equal to a difference in electrical length between the second transmission line and the first transmission line,
the electrical length of the first transmission line is within a range from 70 degrees to 90 degrees,
the electrical length of the second transmission line is within a range from 90 degrees to 180 degrees, and
the characteristic impedance of the first transmission line and the characteristic impedance of the second transmission line are smaller than a value obtained by doubling the external load.

13. The Doherty amplifier according to claim 12, wherein a ratio of a voltage amplitude of the first signal input to the first amplifying element and a voltage amplitude of the second signal input to the second amplifying element is controlled in order that the voltage amplitude of the second signal input to the second amplifying element is 0 when the voltage amplitude of the first signal input to the first amplifying element is equal to or less than a threshold, and rises when the voltage amplitude of the first signal input to the first amplifying element is larger than the threshold.

14. The Doherty amplifier according to claim 13, wherein the ratio of the voltage amplitude of the first signal to the voltage amplitude of the second signal approaches asymptotically 1 with an increase in output power levels of the first amplifying element and the second amplifying element.

15. The Doherty amplifier according to claim 13, wherein the phase difference between the first signal and the second signal has a value having a variation in a range of ±20%.

16. The Doherty amplifier according to claim 12, wherein a phase difference between a signal output from the first amplifying element and a signal output from the second amplifying element is constant regardless of input power levels of the first amplifying element and the second amplifying element.

17. The Doherty amplifier according to claim 12, further comprising:
a divider circuit to divide an input signal;
a first phase adjustment line to generate a first delay for the signal divided by the divider circuit; and
a second phase adjustment line to further generate a second delay for the signal having passed through the first phase adjustment line, wherein a
sum of passing phases of the first phase adjustment line and the second phase adjustment line is equal to the phase difference between the first signal and the second signal.

18. The Doherty amplifier according to claim 12, wherein the phase difference between the first signal and the second signal is larger than a difference in electrical length between the second transmission line and the first transmission line.

19. The Doherty amplifier according to claim 12, wherein the phase difference between the first signal and the second signal is smaller than a difference in electrical length between the second transmission line and the first transmission line.

20. The Doherty amplifier according to claim 12, wherein a phase difference between the second signal input to the second amplifying element and the first signal input to the first amplifying element is within a range from 45 degrees to 90 degrees.

* * * * *